(12) United States Patent
Yamaguchi et al.

(10) Patent No.: US 7,592,108 B2
(45) Date of Patent: Sep. 22, 2009

(54) METHOD OF DETECTING RELATIVE POSITION OF EXPOSURE MASK AND OBJECT TO BE EXPOSED, ALIGNMENT METHOD, AND EXPOSURE METHOD USING THE SAME

(75) Inventors: Takako Yamaguchi, Atsugi (JP); Ryo Kuroda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 509 days.

(21) Appl. No.: 10/529,908

(22) PCT Filed: May 12, 2004

(86) PCT No.: PCT/JP2004/006696

§ 371 (c)(1),
(2), (4) Date: Dec. 16, 2005

(87) PCT Pub. No.: WO2004/099879

PCT Pub. Date: Nov. 18, 2004

(65) Prior Publication Data

US 2006/0152703 A1    Jul. 13, 2006

(30) Foreign Application Priority Data

May 12, 2003   (JP)   ............... 2003-132587

(51) Int. Cl.
*G03F 9/00* (2006.01)
(52) U.S. Cl. .................. 430/22; 430/5; 430/322; 355/76; 355/78
(58) Field of Classification Search .......... 430/5, 430/22, 322; 355/53, 75–78; 250/519.1

See application file for complete search history.

(56) References Cited

U.S. PATENT DOCUMENTS 5,334,466 A    8/1994   Yasui et al. ................ 430/5

(Continued)

FOREIGN PATENT DOCUMENTS

EP    1 150 162 A2    10/2001

OTHER PUBLICATIONS

International Search Report mailed Feb. 14, 2005, issued in International Application No. PCT/JP2004/006696.

(Continued)

*Primary Examiner*—Mark F Huff
*Assistant Examiner*—Stewart A Fraser
(74) *Attorney, Agent, or Firm*—Fitzpatrick, Cella, Harper & Scinto

(57) ABSTRACT

A near-field exposure method including preparing a photomask for near-field exposure, having a light blocking film provided on a base material constituting a membrane portion and a support member supporting the base material, wherein a first alignment mark for rough alignment is provided on the support member and a second alignment mark for fine alignment is provided on the membrane portion, setting the photomask and an object to be exposed in a near-field exposure apparatus, aligning the photomask and the object using the first alignment mark, flexing the membrane portion to contact with the object and detecting a positional relation between the membrane portion and the object using the second alignment mark, aligning the photomask and the object based on the detected positional relation and flexing the membrane portion to contact with the object, and exposing the object to light from a light source by way of the photomask.

3 Claims, 6 Drawing Sheets

U.S. PATENT DOCUMENTS

| | | | |
|---|---|---|---|
| 6,171,730 B1 | 1/2001 | Kuroda et al. | 430/5 |
| 6,187,482 B1 | 2/2001 | Kuroda et al. | 430/5 |
| 6,212,252 B1 | 4/2001 | Kise et al. | 378/35 |
| 6,252,649 B1 | 6/2001 | Sangu | 355/53 |
| 6,559,926 B2 | 5/2003 | Yamaguchi et al. | 355/53 |
| 6,628,392 B2 | 9/2003 | Kuroda et al. | 356/400 |
| 6,632,593 B2 | 10/2003 | Yamaguchi et al. | 430/322 |
| 6,720,115 B2 | 4/2004 | Inao et al. | 430/5 |
| 7,068,353 B2 | 6/2006 | Yano et al. | 355/67 |
| 2002/0130425 A1* | 9/2002 | Koike et al. | 257/797 |
| 2004/0080732 A1 | 4/2004 | Kuroda et al. | 355/53 |
| 2004/0121245 A1 | 6/2004 | Inao et al. | 430/5 |
| 2004/0166421 A1 | 8/2004 | Yamaguchi et al. | 430/5 |
| 2005/0064301 A1 | 3/2005 | Yamaguchi et al. | 430/5 |
| 2005/0064303 A1 | 3/2005 | Yamada et al. | 430/5 |
| 2006/0003233 A1 | 1/2006 | Yamaguchi et al. | 430/5 |
| 2006/0003269 A1 | 1/2006 | Ito et al. | 430/323 |
| 2006/0007440 A1 | 1/2006 | Kuroda et al. | 356/400 |
| 2006/0014108 A1 | 1/2006 | Ito et al. | 430/322 |

OTHER PUBLICATIONS

Written Opinion mailed Feb. 14, 2005, issued in International Application No. PCT/JP2004/006696.

* cited by examiner

FIG.5A — STRUCTURE 106 TO BE USED IN SECOND-STAGE ALIGNMENT

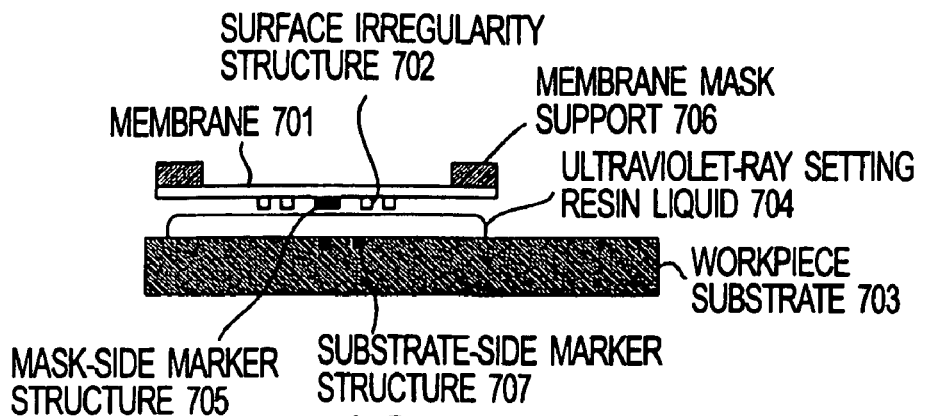
FIG. 7A
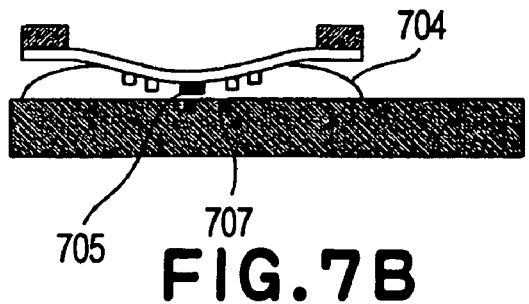
FIG. 7B
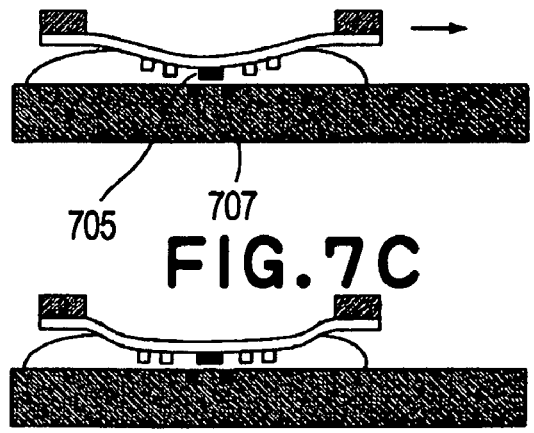
FIG. 7C
FIG. 7D
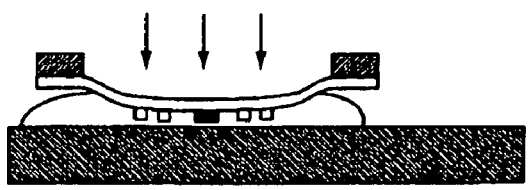
FIG. 7E

METHOD OF DETECTING RELATIVE POSITION OF EXPOSURE MASK AND OBJECT TO BE EXPOSED, ALIGNMENT METHOD, AND EXPOSURE METHOD USING THE SAME

This application claims priority from Japanese Patent Application No. 2003-132587 filed May 12, 2003, which is hereby incorporated in its entirety by reference.

TECHNICAL FIELD

This invention relates to exposure technology that enables the manufacture of fine patterns and, specifically, to a method of detecting a relative position of an exposure mask and an object to be exposed, an alignment method, an exposure method using such an alignment method, an exposure mask, and an exposure apparatus having such a mask.

BACKGROUND ART

Because of continuing increases in the capacity of a semiconductor memory or in the speed or integration density of a CPU processor, further advancements of microprocesses based on optical lithography are indispensable.

Generally, the limit of microprocesses using optical lithography apparatuses is on an order of the wavelength of light used. For this reason, the wavelengths of light used in optical lithographic apparatuses have been shortened. Currently, near-ultraviolet ray lasers are used, and the microprocessing on a 0.1 micron order is enabled.

Although the minuteness attainable with the optical lithography has advanced, in order to accomplish microprocessing on an order of 0.1 micron or narrower, there still remain many problems to be solved, such as the necessity of shortening the laser wavelength further, or developing lenses usable with such a wavelength region.

On the other hand, as a measure for enabling optical microprocessing on an order of 0.1 micron or narrower, a microprocessing apparatus using a structure of a near-field optical microscope, hereinafter, "SNOM" (Scanning Near-field Optical Microscope), has been proposed. An example is an apparatus in which, by use of evanescent light seeping or escaping from small openings of a size not greater than 100 nm, local exposure exceeding the limit of the wavelength of light is carried out to a resist.

However, in lithographic apparatuses using such an SNOM structure, the microprocessing is carried out on the basis of continuous drawing using one probe (or a few probes). Thus, there is a problem of low throughput.

As a measure for solving this problem, U.S. Pat. No. 6,171,730 discloses a method in which a photomask is formed with a pattern designed so that near-field light seeps from between light blocking films, and the exposure is carried out while the photomask is closely contacted to a photoresist applied to a substrate, so that a fine pattern of the photomask is transferred to the resist at once.

The method and apparatus disclosed in the specification of this patent is excellent, and it makes a large contribution to the technical field to which the present invention belongs.

The near-field exposure method can produce a fine pattern on an order of tens of nanometers, being much smaller than the wavelength of light used for the exposure. For this reason, in the aforementioned U.S. patent, the photomask is provided with a membrane portion and, by flexing it, the membrane portion is approximated to a photoresist up to the near-field region, such that the exposure is carried out in an intimate contact state.

Here, if the alignment operation is carried out while the membrane portion of the photomask and the photoresist are spaced from each other, and if they are subsequently approximated to each other up to the near-field region, and the exposure is carried out in such a state, it may cause a positional deviation of the near-field exposure pattern, due to the flexure of the membrane portion. Also, such a positional deviation may cause a decrease in the yield of the device production.

However, conventional reduction projection system optical lithography or alignment methods for X-ray exposure, using a mask having a membrane portion, are basically an exposure method in which, during the exposure process, the photoresist and the photomask are exposed, while they are kept separated from each other. Thus, in these methods, there is no suggestion for a problem in a case in which, during the exposure process, a photomask and a photoresist are exposed, while they are placed close to or in intimate contact with each other. Therefore, these conventional methods cannot be directly applied to an alignment method for the near-field exposure.

On the other hand, U.S. Pat. No. 6,252,649 discloses an aligner comprising an aligner device for relatively moving and aligning a mask having a pattern depicted thereon to be exposed and an object having a photosensitive layer to be subjected to the exposure through the mask, a contacting device for contacting the mask and the object as aligned, a detecting device for detecting the alignment accuracy of the mask and the object as contacted, separating means responsive to the detecting device for separating the mask and the object from each other when the alignment accuracy of the contacted mask and object is detected by the detecting device, to be out of a predetermined tolerance and in order to align the mask and the object again, and an exposure apparatus for exposing the mask to the object as contacted with each other.

Additionally, the aforementioned U.S. Pat. No. 6,252,649 shows a specific aligner in which a pressure film is used to press a film-mask, thereby to cause deformation of the film-mask. The pressure film is expanded to press the film-mask against the work to closely contact the former to the latter.

However, in the aligner apparatus disclosed in U.S. Pat. No. 6,252,649, the pressure film and the film-mask are made separate, such that there is a space between the pressure film and the film-mask. Thus, if a foreign particle, such as dust, is present in such a space, it may cause incomplete contact of the mask to the workpiece. Even if the close contact is complete, the light projected from a light source would be influenced by the foreign particle, and accurate exposure would be prevented thereby.

DISCLOSURE OF THE INVENTION

The present invention provides a method and an apparatus by which the above-described problems can be solved.

The present invention provides a method of detecting a relative position of an exposure mask and an object to be exposed, wherein exposure is carried out while the exposure mask, having a light blocking film formed at a membrane portion thereof, is closely contacted to the object to be exposed, and light from a light source is projected to the object to be exposed, through the exposure mask, and wherein the relative position of the exposure mask and the object to be exposed is to be detected prior to the exposure, the method including the steps of preparing the exposure mask having a light blocking film provided on a base material constituting the membrane portion and having a structure for performing position detection, and flexing the membrane portion and detecting, by use of the structure, a relative position of the exposure mask and the object to be exposed, in a state in which the exposure mask is contacted to the object to be exposed.

The present invention provides an alignment method for an exposure mask and an object to be exposed, wherein exposure is carried out while the exposure mask having a light blocking film formed at a membrane portion thereof is closely contacted to the object to be exposed and light from a light source is projected to the object to be exposed, through the exposure mask, and wherein alignment of the exposure mask and the object to be exposed is to be carried out prior to the exposure, the method including the steps of preparing the exposure mask having a light blocking film provided on a base material constituting the membrane portion and having a structure for performing position detection, flexing the membrane portion and detecting, by use of the structure, a relative position of the exposure mask and the object to be exposed, in a state in which the exposure mask is contacted to the object to be exposed, and aligning the exposure mask and the object to be exposed, with each other, on the basis of a result of the position detection.

In accordance with the present invention, when a deviation with reference to a position to be exposed is detected by the position detection, the flexure of the membrane portion may be removed and the exposure mask and the object to be exposed may be relatively moved so as to remove the positional deviation, and subsequently, the membrane portion may be flexed again to be contacted to the object to be exposed and, in that state, the position detection may be carried out, wherein the above-described procedure may be repeated once or more until the deviation comes into a predetermined tolerable range for exposure precision, whereby the alignment is carried out.

In accordance with the present invention, the structure for performing the position detection may be formed adjacent to a center of the membrane or around the membrane.

The present invention provides an exposure method, including the steps of aligning an exposure mask and an object to be exposed, by use of an alignment method of the present invention, and performing exposure by projecting light from a light source to the object to be exposed, through the exposure mask, while the exposure mask is closely contacted to the object to be exposed.

The present invention provides an exposure mask having a membrane portion including a flexible structure, characterized in that a light blocking film is provided on a base material constituting the membrane portion, and that a structure for performing alignment of the object to be exposed and the exposure mask is provided at a central portion of the membrane portion or around the membrane portion.

In the exposure mask according to the present invention, the structure for performing the alignment may be constituted by an opening formed in the light blocking film.

The present invention provides an exposure apparatus, characterized by an exposure mask of the present invention, a pressure adjusting device for causing flexure of a membrane portion of the mask, a first driving device for narrowing a distance between the mask and a workpiece having an object to be exposed, applied thereto, a second driving device for establishing parallelism between a mask surface of the mask and a surface of the object to be exposed, a position detecting mechanism for detecting a position to be exposed, by use of a structure for performing the alignment, a third driving device for changing a relative position of the mask and the workpiece having the object to be exposed, on the basis of information supplied from the position detecting mechanism, and an exposure light source.

In accordance with the present invention, when an exposure mask having a membrane portion is closely contacted to a photoresist and exposure is carried out, the position can be detected with a smaller deviation with respect to the position to be detected. Thus, the present invention assures an alignment method, an exposure method using the alignment method, an exposure mask, and an exposure apparatus having such a mask, by which the yield of device production can be improved.

Particularly, in the present invention, the mask is provided with a light blocking film formed on a base material constituting the membrane portion. Thus, the light blocking film and the membrane portion are formed integrally. Therefore, there is no possibility of dust or any other foreign particles from entering between them, and the above-described technical advantages are still assured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5A-5D are views for explaining the procedure of an exposure method in an embodiment of the present invention, in a case wherein a structure to be used for the alignment is formed around the membrane.

FIGS. 7A-7E are views for explaining the procedure of an optical nano-imprint exposure method using a membrane mask in Example 3 of the present invention.

BEST MODE FOR PRACTICING THE INVENTION

Figure 1:
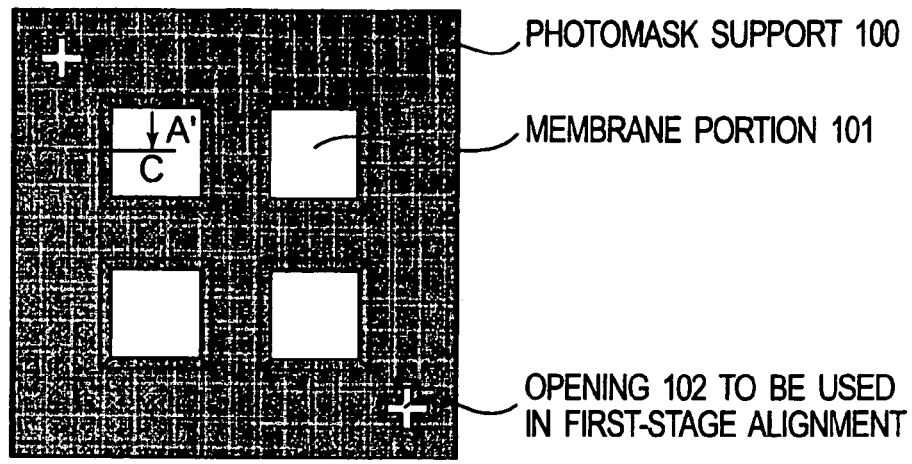
FIG. 1 is a plan view of a photomask in an embodiment of the present invention, as seen from the entrance side of exposure light.

FIG. 1 is a plan view of a photomask in an embodiment of the present invention, as seen from the entrance side of exposure light.

In FIG. 1, the photomask comprises a photomask support 100, a membrane portion 101 having a thickness of about 0.1-100 µm, and an opening 102 to be used in first-stage alignment. Additionally, while not shown in FIG. 1, the photomask further comprises a membrane base material 103, a light blocking film 104, an exposure pattern 105 formed at the back side of the membrane portion, and a structure 106 to be used in second-stage alignment.

Here, the opening 102 to be used for the first-stage alignment is necessary only when the first-stage alignment is to be performed. An example is the exposure of a workpiece for producing a structure in a first layer. If strict positional precision is not required for the workpiece, the first-stage alignment may be omitted. In such a case, as a matter of course, the opening for use in the first-stage alignment is unnecessary.

FIG. 1 shows a case where there are four membrane portions 101. However, a single photomask may have membrane portions of any number. From the standpoint of strength of the photomask, the membrane portions may preferably be disposed symmetrically with respect to the center of the photomask.

As regards the shape of the membrane, although a square shape is illustrated, it may have any other shape. With regard to ease of processing, an oblong shape is good, but when tensile stress or distortion of the membrane as it is flexed are taken into account, the square shape is more preferable than the oblong shape. Also, while the easiness of the processing may be inferior, a regular polygon having vertices of a number larger than that of the square shape is preferable.

Although the photomask support 100 illustrated has a rectangular shape, it may have any other shape, such as a circular shape, for example. From the standpoint of performing initial alignment prior to the first-stage alignment, a rectangular or even a circular shape with an orientation flat is preferable, because the orientation can be detected easily.

As regards the opening 102 to be used for the first-stage alignment, the illustrated example uses two cross-shaped openings. The presence/absence, disposition, number and shape of the openings may be different in accordance with the necessity of the first-stage alignment and the required precision thereof.

FIG. 2 shows the section, along a line A-A', of the photomask shown in FIG. 1. In FIG. 2, denoted at C is the center of the photomask. Also, FIG. 2 illustrates an opening defined by processing the light blocking film 104, as an example of the structure 106 to be used in the second-stage alignment.

As regards the alignment method for the second stage, various methods are usable such as, for example, a method in which light having a low sensitivity to the workpiece is projected through the use of an opening, and the quantity of reflected light from the structure formed on the workpiece is detected, or an image is provided by reflected light. Alternatively, the quantity or intensity of light emission from a fluorescent substance provided on the workpiece may be detected.

As regards the structure for use in the alignment, in place of the opening, an STM (scanning tunnel microscope) probe structure may be used and, on that occasion, the shape of a structure formed on the workpiece can be detected.

Figure 2A:
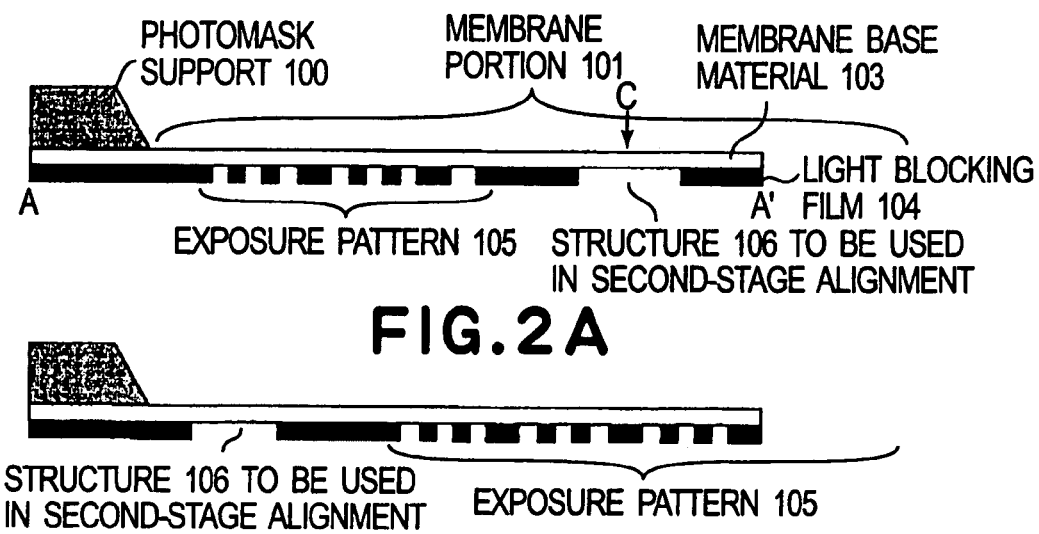
FIGS. 2A and 2B are sectional views, taken on line A-A', of the photomask in an embodiment of the present invention shown in FIG. 1.
Figure 2B:

The exposure pattern 105 shown in FIG. 2 is merely an example. This pattern is variable arbitrarily in accordance with what is required for the product. Specifically, FIG. 2A shows a case wherein the structure 106 to be used for the second-stage alignment is formed adjacent to the center of the membrane portion 101. FIG. 2B shows a case wherein the structure 106 is formed around the membrane portion 101.

Referring to FIG. 3, the near-field exposure method using a photomask of the structure shown in FIG. 2A, will be explained.

Figure 3A:
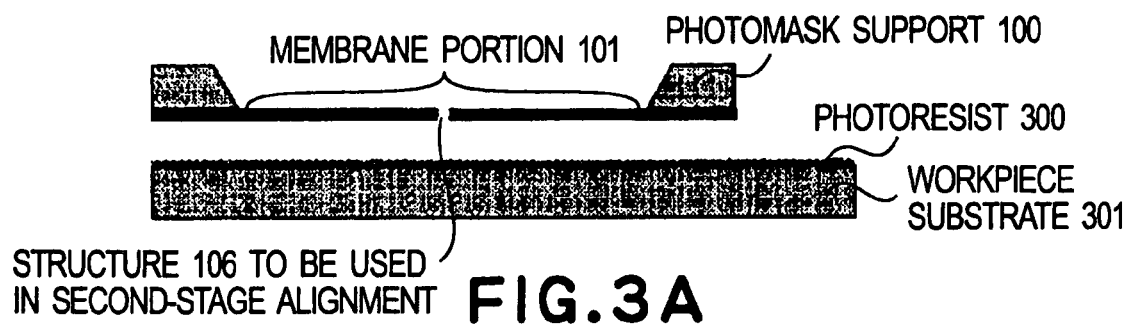
FIGS. 3A-3D are views for explaining the procedure of a near-field exposure method using a photomask of the structure shown in FIG. 2A, in an embodiment of the present invention.

First of all, the photomask having a structure to be used in the second-stage alignment, formed adjacent to the center of the membrane portion 101, is disposed so that its light blocking film is opposed to a photoresist 300 formed on the workpiece 301, the photoresist being the object to be exposed (FIG. 3A). Here, as regards the distance between the light blocking film surface and the photoresist surface, although it depends on the area of the membrane portion, from the standpoint of the durability of the membrane portion, the distance should be not greater than 100 μm, and they should be placed close to each other, unless the membrane portion and the photoresist surface do not contact with each other.

Figure 3B:

Subsequently, by decreasing the pressure between the membrane portion 101 and the photoresist 300 or, alternatively, by pressurizing the membrane 101 from the mask support 100 side, the membrane 101 is flexed until only the central portion thereof contacts the photoresist 300 (FIG. 3B).

Then, position detection is carried out by using the structure 106 (alignment marker) to be used in the second-stage alignment formed adjacent to the center of the membrane portion 101, as well as an alignment marker structure provided on the workpiece 301. If a deviation between this position and the position to be exposed is within a tolerable range for the required exposure precision, the photomask is further flexed, so that the whole surface of the exposure pattern is closely contacted to the photoresist 300. Thereafter, the exposure is carried out.

Figure 3C:

If the deviation is beyond the tolerable range for the required exposure precision, the relative position of the photomask and the workpiece is shifted in a direction of an arrow, being parallel to the opposed surfaces of them, while the central portion of the membrane and the photoresist are kept in contact with each other, and they are brought into alignment with each other, so that the positional deviation comes into the tolerable range (FIG. 3C).

Figure 3D:

After this, the photomask is flexed furthermore, and the whole surface of the exposure pattern is closely contacted to the photoresist. Then, exposure light is projected to the membrane from the photomask support side, and exposure is carried out (FIG. 3D).

With this arrangement, the exposure can be accomplished while the positional deviation, between a time prior to flexing of the membrane portion, and at the time of exposure where the membrane is flexed, is removed. Therefore, the positional deviation of the pattern can be made small, and the yield of device production can be improved.

When relatively moving the central portion of the membrane and the photoresist, while they are kept in contact with each other, may cause a problem, such as breakage of the membrane, shortening the lifetime of the membrane, roughening of the photoresist surface (it may cause a problem in a post-process), for example, the procedure shown in FIG. 4 may be used.

What differs from the above-described procedure is as follows. The position detection is carried out by using structures (alignment marker structures) for use in the second-stage alignment, provided on the workpiece 301 and the membrane portion 101. If the deviation between this position and the position to be exposed is out of the tolerable range for the required exposure precision, first, the flexure of the membrane portion is removed, to separate the membrane and the photoresist from each other. After this, the relative position of the photomask and the workpiece is moved in a direction of an arrow, being parallel to the opposed surfaces of them, so that they are brought into alignment (FIG. 4C).

Subsequently, the membrane portion is flexed again, to the extent that only the central portion of the membrane contacts the photoresist, and then, the position detection is carried out. If a deviation between this position and the position to be exposed is within a tolerable range for the required exposure precision, the photomask is further flexed, so that the whole surface of the exposure pattern is closely contacted to the photoresist 300. Thereafter, the exposure is carried out (FIG. 4D).

Figure 4A:
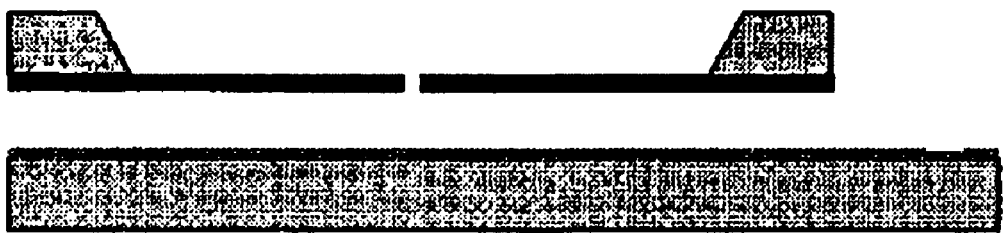
FIGS. 4A-4D are views for explaining the procedure of an exposure method in an embodiment of the present invention, in a case wherein breakage of a membrane, for example, is a problem to be considered.
Figure 4B:
Figure 4C:
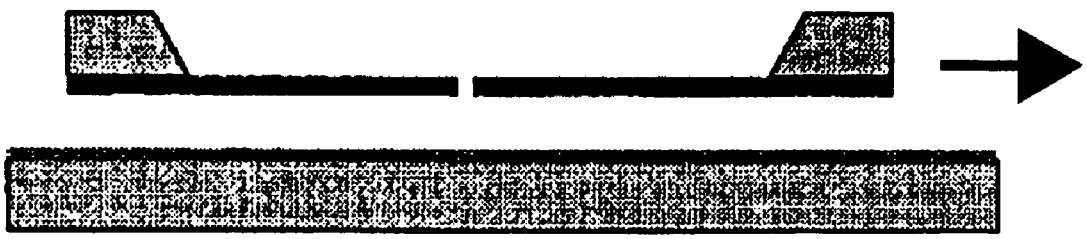
Figure 4D:
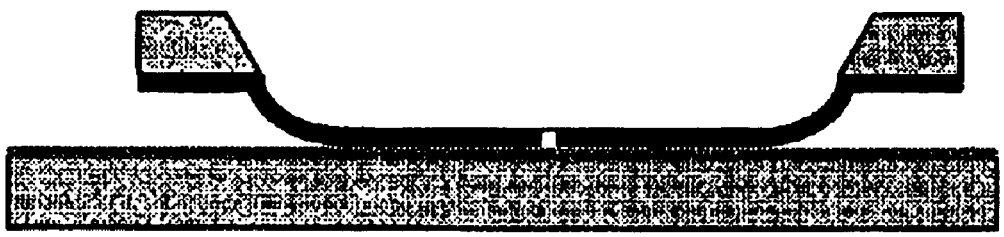

If the deviation is beyond the tolerable range for the required exposure precision, even after completion of the translational motion (FIG. 4C), the above-described procedure, that is, the operation of FIGS. 4B and 4C, is repeated.

If the deviation between this position and the position to be exposed comes into a tolerable range for the required exposure precision, the photomask is further flexed, so that the whole surface of the exposure pattern is closely contacted to the photoresist 300. Thereafter, by projecting exposure light to the membrane from the mask support side, the exposure is carried out (FIG. 4D).

With this arrangement, the exposure can be accomplished while the positional deviation, between a time prior to flexing the membrane portion and at the time of exposure where the membrane is flexed, is removed. Therefore, the positional deviation of the pattern can be made small, and the yield of device production can be improved.

Furthermore, since a force to be applied to the central portion of the membrane or to a photoresist that contacts the central portion of the membrane is reduced, the lifetime of the photomask can be prolonged and deterioration of the resist pattern can be prevented.

If the structure (alignment marker structure) to be used in the second-stage alignment cannot be formed adjacent to the membrane center, for some reason related to the exposure pattern, such a structure may be provided around the membrane, as in the photomask shown in FIG. 2B.

Referring to FIG. 5, the near-field exposure method, using a photomask of the structure shown in FIG. 2B, will be explained.

First of all, a photomask having a structure 106 (alignment marker structure) to be used in the second-stage alignment, formed around the membrane portion 101, is disposed so that, like the example of FIG. 3, its light blocking film is opposed to a photoresist 300 formed on the workpiece 301, the photoresist being the object to be exposed (FIG. 5A).

Figure 5B:
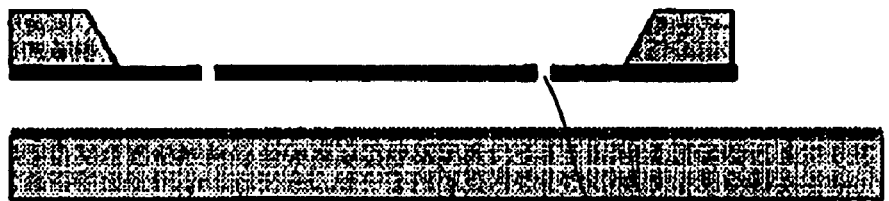
Figure 5B:
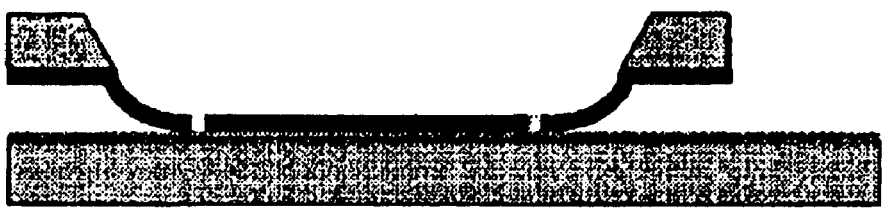

Subsequently, the membrane portion 101 is flexed until the portion having the structure 106 is contacted to the photoresist 300 (FIG. 5B).

Then, position detection is carried out by using the structure (alignment marker structure), to be used in the second-stage alignment, provided on the membrane portion 101 and the workpiece 301. If a deviation between this position and the position to be exposed is within a tolerable range for the required exposure precision, the photomask is further flexed, so that the whole surface of the exposure pattern is closely contacted to the photoresist 300. Thereafter, the exposure is carried out.

Here, a plurality of alignment marker structures for use in the alignment may be provided at symmetrical positions about the membrane center, and, on that occasion, the positional deviation can be detected from an average of the positions detected by these structures. This improves the precision much more, and it is particularly effective to the correction of positional deviation caused as a result of flexing the membrane.

If the deviation is beyond the tolerable range for the required exposure precision, the relative position of the photomask and the workpiece is shifted in a direction of an arrow, being parallel to the opposed surfaces of them, and they are brought into alignment with each other so that the positional deviation comes into the tolerable range. After this, the photomask is flexed furthermore, and the whole surface of the exposure pattern is closely contacted to the photoresist 300. Then, exposure light is projected to the membrane from the photomask support side, and exposure is carried out (although not shown in the drawings).

Figure 5C:
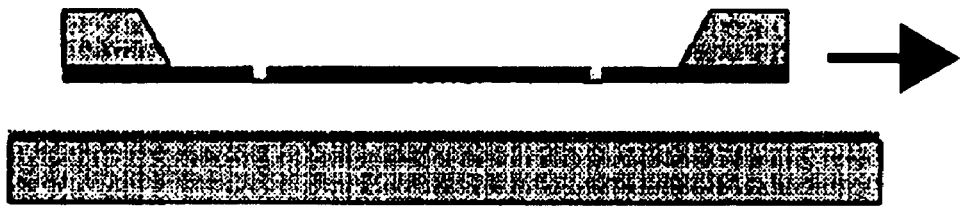

If relatively moving the central portion of the membrane and the photoresist, while they are kept in contact with each other, may cause a problem, such as breakage of the membrane, reduction in lifetime of the membrane, roughening of the photoresist surface (resulting in a problem in a post-process), for example, the flexure of the membrane portion may be removed and, after this, the relative position of the photomask and the workpiece may be moved in parallel to the opposed surfaces of them (FIG. 5C).

Figure 5D:
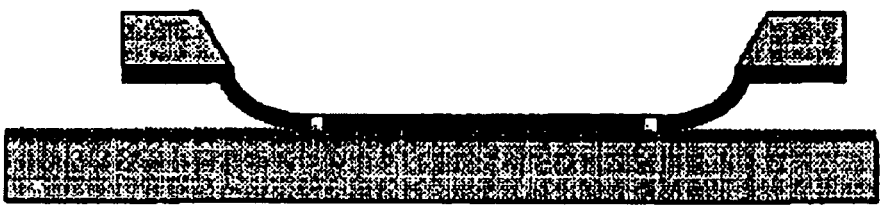

If the deviation is beyond the tolerable range for the required exposure precision, even after completion of the translational motion, the above-described procedure is repeated until the deviation comes within the tolerable range for the required exposure precision, as in the case of FIG. 4 (FIG. 5D).

With this arrangement, even if the structure to be used in the second-stage alignment cannot be formed adjacent to the membrane center, for some reason related to the exposure pattern, the exposure can be accomplished while the positional deviation, between a time prior to flexing the membrane portion and the time of exposure where the membrane is flexed, is removed. Therefore, the positional deviation of the pattern can be made small, and the yield of device production can be improved.

Furthermore, when the relative position of the photomask and the workpiece is to be changed, the flexure of the membrane portion is removed and the membrane is separated from the photoresist. As a result, a force, to be applied to the central portion of the membrane or to a photoresist that contacts the central portion of the membrane, is reduced. Therefore, the lifetime of the photomask can be prolonged, and deterioration of the resist pattern can be prevented.

In an alignment method according to the present invention, if the peripheral portion of the membrane mask is supported by a rigid supporting member, such as shown in FIG. 1, deformation of the membrane responsive to pressure application is such that the membrane center shifts in a direction of a normal to the membrane surface. Such deformation is similar to deformation of a beam being supported at its opposite ends, and it shows excellent parallelism in the normal direction, as well as a good reproducibility. Thus, it provides an advantage of higher precision alignment.

Regarding the alignment method, while the near-field exposure method has been explained as an example, the present invention is not limited to this. The present invention is also applicable to any other exposure method, such as, for example, an optical nano-imprint exposure method in which a membrane mask is flexed.

Next, some examples of the present invention will be explained.

EXAMPLE 1

Figure 6:
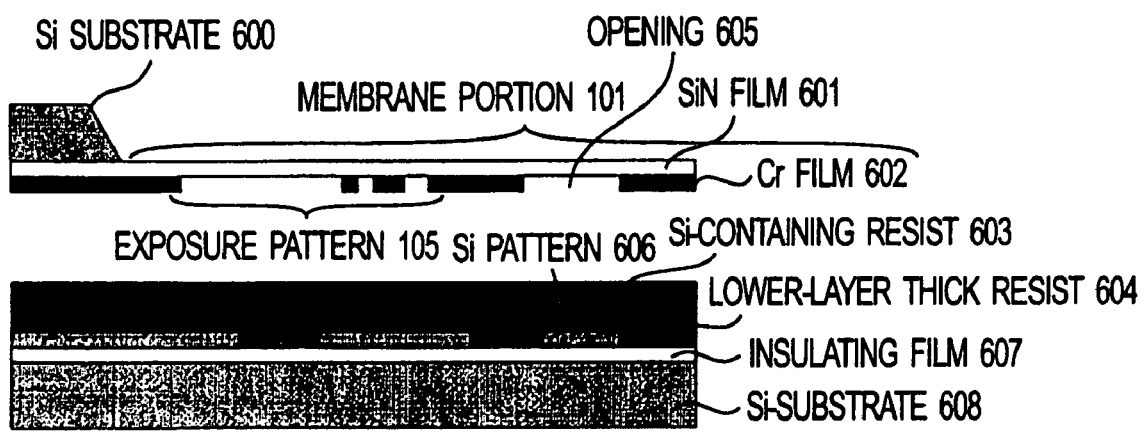
FIG. 6 is a sectional view of a photomask and a workpiece to be processed, in Example 1 of the present invention.

FIG. 6 is a schematic view of a portion of a photomask and a workpiece used in this example.

As regards the photomask support, a Si substrate 600 was used. On this Si substrate 600, SiN film 601, as a membrane base material, was formed with a film thickness of 300 nm. On this film, Cr film 602, which functions as a light blocking film for the exposure light, was formed by vapor deposition, with a film thickness of 50 nm. By processing the Cr film 602 by use of an FIB (focusing ion beam) processing machine, an exposure pattern 105 (an original pattern for exposure of the photoresist) and an opening 605 to be used in the second-stage alignment were produced in a portion of the Cr film 602. The exposure pattern 105 includes a fine pattern having a smallest linewidth of 50 nm.

Thereafter, back-etching of the Si substrate 600 was carried out relative to the SiN film 601, from the side of the photomask remote from its Cr film 602 portion, whereby the membrane portion 101 was formed. During the back-etching of the Si substrate 600, the openings (not shown) to be used in the first-stage alignment were also made.

In this example, in regard to a Si pattern 606 formed upon an insulative film 607 on a Si substrate 608, an SOI substrate having a fine metal pattern formed thereon was used as a workpiece substrate. On this workpiece substrate, a lower-layer thick resist 604 was formed by spin coating, with a film thickness of 200 nm. Then, it was heated in an oven at 200° C. for one hour. Thereafter, a Si containing resist 603 for g-line exposure was applied to a film thickness of 50 nm, and pre-baking was performed by using a hot plate, at 90° C. for ninety seconds.

The Cr film side (light blocking film) of the photomask and the Si containing resist 603 side of the SOI substrate were disposed opposed to each other. The photomask was held by fixing the Si substrate 600 (supporting portion) by use of a vacuum chuck. Regarding the SOI substrate, the Si substrate 608 was fixed on a stage. In such a state, the light blocking film surface (Cr film 602) and the Si containing resist 603 surface were approximated to each other so that the interval between them became equal to 50 μm.

In such a state, the opening to be used in the first-stage alignment was used, and yellow light, provided by cutting short wavelengths in white light, having high exposure sensitivity to the Si containing resist, was used to perform the alignment, whereby rough alignment of the photomask and the workpiece opposed to it was carried out.

Subsequently, a pump was used to pressurize the membrane portion 101 from the Si substrate 600 side, to cause flexure of the membrane portion 101. Simultaneously, similar yellow light as described above was used, and while observing an interference fringe produced on the membrane from the photomask supporting member side, only the Cr film adjacent to the opening 605 was brought into contact with the Si containing resist 603. In such a state, through the opening 605 formed adjacent to the center of the membrane portion 101, light having a wavelength having low exposure sensitivity to the Si containing photoresist 603 was projected, and the intensity of reflected light from the Si pattern 606 was detected by a detector. Based on this, a relative positional deviation between the photomask and the workpiece is detected. Since this example used Si containing resist for g-line exposure light, a red laser having a wavelength of 635 nm was used to perform the position detection, and a positional deviation of 0.7 μm was found with respect to the alignment marker on the SOI substrate.

The positional deviation was removed by moving a stage on the SOI substrate side, and thereafter, by applying pressure to the membrane, until the whole surface of the exposure pattern in the membrane closely contacted to the Si containing resist 603, whereby the membrane 101 was flexed. In such a state, light from an Hg lamp was projected to the whole surface of the photomask from the Si substrate 600 side, whereby the exposure was carried out.

Subsequently, by developing the Si containing resist 603, a pattern of the Si containing resist 603 was produced. By using it as a mask and by using an oxygen gas, dry etching was carried out to the lower-layer thick resist 604, whereby a resist pattern was produced. Thereafter, metal was applied by vapor deposition and, then, the resist was removed. With this procedure, a fine metal pattern having a small positional deviation with respect to the Si pattern 606 on the insulating film 607 can be produced. Therefore, the yield of device production can be improved.

EXAMPLE 2

In this embodiment, the procedure up to the position detection using the opening 605 is the same as that Example 1, and a description thereof will be omitted.

As in Example 1 described above, position detection was carried out by use of a red laser having a wavelength of 635 nm, and a positional deviation of 0.7 μm was found with respect to an alignment marker on the SOI substrate.

Here, by using a pump, the membrane portion 101 was depressurized from the Si substrate 600 side to reduce the flexure of the membrane portion 101, so that the membrane portion 101 was disengaged from the Si containing resist 603. Also, it can be checked by observing an interference fringe produced at the membrane, by use of yellow light and from the photomask supporting member side.

Thereafter, the stage at the SOI substrate side was moved to remove the positional deviation, and then the membrane was pressurized, until the whole surface of the exposure pattern of the membrane was closely contacted to the Si containing resist 603, whereby the membrane portion 101 was flexed. In such a state, light from an Hg lamp was projected to the whole surface of the photomask from the Si substrate 600 side, and exposure was carried out. The procedure following this is similar to that of Example 1.

With the exposure process according to the method described above, a fine metal pattern having a small positional deviation with respect to the Si pattern 606 on the insulating film 607 was produced. Further, the membrane breakage frequency was reduced, and the pattern shape of the Si containing resist after the development was improved. Thus, the yield of device production was improved significantly.

EXAMPLE 3

Referring to FIG. 7, an example, wherein the present invention is applied to an optical nano-imprint exposure method, in which a membrane mask is flexed, will be described.

As shown in FIG. 7A, a mask is constituted by a membrane 701 having a thickness of 0.1-100 μm, and it has an irregularity (inequality) structure 702 formed at its front face. The alignment method, in such an optical nano-imprint exposure method using such a mask, will be performed in the following manner.

First of all, a membrane mask having a mask side marker structure 705, to be used in fine alignment to be performed after rough alignment, formed adjacent to the center of the membrane 701, is disposed so that its front face is opposed to an ultraviolet-ray setting resin liquid 704 (object to be exposed) provided on a workpiece 703 (FIG. 7A).

Subsequently, by depressurizing the space between the membrane 701 portion and the ultraviolet-ray setting resin liquid 704 or by pressurizing the membrane 701 portion from the back side of the membrane mask supporting member 706, the membrane 701 portion is brought into contact, from its central portion, with the ultraviolet-ray setting resin liquid 704. Thus, the membrane is flexed, so that the inequality structure 702 at the membrane mask surface sinks into the ultraviolet-ray setting resin liquid 704 (FIG. 7B).

Then, position detection is carried out by using a mask-side marker structure 705 to be used in the fine alignment, formed adjacent to the center of the membrane 701 portion, as well as a substrate-side marker structure 707. If a deviation between this position and the position to be exposed is within a tolerable range for the required exposure precision, (as will be described with reference to FIGS. 7D and 7E), the membrane mask is further flexed, so that the whole surface of the inequality structure pattern 702 sinks into, and is intimately contacted to, the ultraviolet-ray setting resin liquid 704, until a portion adjacent to the surface of the workpiece 703. Thereafter, ultraviolet light is projected to set the resin liquid 704.

If the deviation is beyond the tolerable range for the required exposure precision, the relative position of the membrane mask 701 and the workpiece 703 is shifted in a direction of an arrow, being parallel to the opposed surfaces of them, while the central portion of the membrane 701 and the ultraviolet-ray setting resin liquid 704 are kept in contact with each other, and thus, alignment is carried out (FIG. 7C).

After this, the membrane mask is flexed furthermore, and the whole surface of the inequality structure 702 pattern is sunk into the ultraviolet-ray setting resin liquid 704, up to a portion adjacent to the surface of the workpiece 703 (FIG. 7D). Thereafter, the ultraviolet light is projected to set the resin liquid 704 (FIG. 7E).

With this arrangement, the exposure can be accomplished, while the positional deviation, between a time prior to flexing the membrane portion and the time of exposure where the membrane is flexed, is removed. Therefore, the positional deviation of the pattern can be made small, and the yield of device production can be improved.

The invention claimed is:

1. A near-field exposure method comprising:
   preparing a photomask for near-field exposure, having a light blocking film provided on a base material constituting a membrane portion and a support member supporting the base material, wherein a first alignment mark for rough alignment is provided on the support member and a second alignment mark for fine alignment is provided on the membrane portion;
   setting the photomask and an object to be exposed in a near-field exposure apparatus;
   aligning the photomask and the object using the first alignment mark;
   flexing the membrane portion to contact with the object and detecting a positional relation between the membrane portion and the object using the second alignment mark;
   repeating the flexing step to recognize that a deviation from a correct position of the membrane corresponding to the object is in an acceptable range; and
   exposing the object to light from a light source by way of the photomask.

2. A near field exposure method according to claim 1, wherein, when a deviation with reference to a position to be exposed is detected in the position detection, the flexure of the membrane portion is removed, and the exposure mask and the object to be exposed are relatively moved so as to remove the positional deviation, and subsequently, the membrane portion is flexed again to be contacted to the object to be exposed and, in that state, the position detection is carried out, and wherein this procedure is repeated once or more until the deviation comes into a predetermined tolerable range for exposure precision, whereby the alignment is carried out.

3. A near-field exposure method according to claim 1, wherein the second alignment mark is formed at one of (i) adjacent to a center of the membrane and (ii) around the membrane.

* * * * *